(12) United States Patent
Kinouchi et al.

(10) Patent No.: US 9,580,306 B2
(45) Date of Patent: Feb. 28, 2017

(54) ROOM TEMPERATURE BONDING APPARATUS AND ROOM TEMPERATURE BONDING METHOD

(71) Applicants: MITSUBISHI HEAVY INDUSTRIES MACHINE TOOL CO., LTD., Ritto-shi, Shiga (JP); NATIONAL INSTITUTE OF ADVANCED INDUSTRIAL SCIENCE AND TECHNOLOGY, Tokyo (JP)

(72) Inventors: Masato Kinouchi, Tokyo (JP); Takayuki Goto, Tokyo (JP); Takeshi Tsuno, Tokyo (JP); Jun Utsumi, Tokyo (JP); Kensuke Ide, Tokyo (JP); Takenori Suzuki, Tokyo (JP); Keiichiro Tsutsumi, Tokyo (JP); Hideki Takagi, Ibaraki (JP); Yuuichi Kurashima, Ibaraki (JP)

(73) Assignees: MITSUBISHI HEAVY INDUSTRIES MACHINE TOOL CO., LTD., Shiga (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/425,966

(22) PCT Filed: Sep. 25, 2013

(86) PCT No.: PCT/JP2013/075955
§ 371 (c)(1),
(2) Date: Mar. 4, 2015

(87) PCT Pub. No.: WO2014/050915
PCT Pub. Date: Apr. 3, 2014

(65) Prior Publication Data
US 2015/0251904 A1    Sep. 10, 2015

(30) Foreign Application Priority Data
Sep. 27, 2012   (JP) .................. 2012-215151

(51) Int. Cl.
B81C 3/00 (2006.01)
H01L 21/67 (2006.01)
(Continued)

(52) U.S. Cl.
CPC .............. *B81C 3/001* (2013.01); *B23K 20/00* (2013.01); *B23K 20/008* (2013.01);
(Continued)

(58) Field of Classification Search
CPC . B23K 20/008; B23K 20/00; H01L 21/67092; H01L 21/67207; H01L 21/2007; B81C 3/001; B81C 99/0025
See application file for complete search history.

(56) References Cited

U.S. PATENT DOCUMENTS

| 2010/0000663 A1 | 1/2010 | Goto et al. |
| 2010/0201735 A1 | 8/2010 | Sato et al. |
| 2011/0214816 A1 | 9/2011 | Goto et al. |

FOREIGN PATENT DOCUMENTS

| JP | 2791429 B2 | 8/1998 |
| JP | 2004-342855 A | 12/2004 |

(Continued)

OTHER PUBLICATIONS

International Preliminary Report on Patentability with English translation for International Application No. PCT/JP2013/075955 issued Mar. 31, 2015.
(Continued)

*Primary Examiner* — Jacob T Minskey
*Assistant Examiner* — Vishal I Patel
(74) *Attorney, Agent, or Firm* — Birch, Stewart, Kolasch & Birch, LLP

(57) ABSTRACT

A room temperature bonding apparatus includes a first beam source, a second beam source, and a press bonding mechanism. The first beam source emits a first activation beam that irradiates a first surface of a first substrate. Independently from the first beam source, the second beam source emits a
(Continued)

second activation beam that irradiates a second surface of a second substrate. The press bonding mechanism bonds between the first substrate and the second substrate by contacting between the first surface and the second surface after the first surface is irradiated with the first activation beam and the second surface is irradiated with the second activation beam. Thus, a plurality of the substrates made of different materials is appropriately bonded.

16 Claims, 11 Drawing Sheets

(51) Int. Cl.
*B23K 20/00* (2006.01)
*B81C 99/00* (2010.01)
*H01L 21/20* (2006.01)

(52) U.S. Cl.
CPC ...... *B81C 99/0025* (2013.01); *H01L 21/2007* (2013.01); *H01L 21/67092* (2013.01); *H01L 21/67207* (2013.01)

(56) References Cited

FOREIGN PATENT DOCUMENTS

| | | |
|---|---|---|
| JP | 2004-358602 A | 12/2004 |
| JP | 2005-268766 A | 9/2005 |
| JP | 2005-294824 A | 10/2005 |
| JP | 2010-199477 A | 10/2005 |
| JP | 2007-005335 A | 1/2007 |
| JP | 2007-281203 A | 10/2007 |
| JP | 4172806 B2 | 10/2008 |
| JP | 2008-283086 A | 11/2008 |
| JP | 2008-311596 A | 12/2008 |
| JP | 2009-010263 A | 1/2009 |
| JP | 2009-147257 A | 7/2009 |

OTHER PUBLICATIONS

International Search Report issued in PCT/JP2013/075955, mailed on Nov. 5, 2013.
Extended European Search Report dated Jun. 19, 2015 for Application No. 13840434.8.
Japanese Office Action, dated Jun. 28, 2016, for Japanese Application No. 2012-215151, together with an English translation thereof.
Decision to Grant a Patent issued in the corresponding Japanese Patent Application No. 2012-215151; issued on Nov. 16, 2016, along with an English Translation thereof.

ROOM TEMPERATURE BONDING APPARATUS AND ROOM TEMPERATURE BONDING METHOD

TECHNICAL FIELD

The present invention relates to a room temperature bonding apparatus and a room temperature bonding method, particularly to a room temperature bonding apparatus and a room temperature bonding method for bonding a plurality of substrates by contacting activated surfaces with each other in a vacuum environment.

BACKGROUND ART

A MEMS (Micro Electro Mechanical Systems) device, in which micro electrical components or micro mechanical components are integrated, is known. As the MEMS device, a micro-machine, a pressure sensor, an ultra-small motor etc. is exemplified. A semiconductor device which is produced by stacking LSI (Large Scale Integration) on a semiconductor wafer is known. Such a semiconductor device can reduce such as increase of leakage current and a signal delay in wiring.

A room temperature bonding for bonding wafers by contacting wafer surfaces with each other, which are activated in a vacuum environment, is known. For example, a bonding method of silicon wafers is disclosed in JP Patent No. 2,791,429 (Patent Literature 1). The room temperature bonding method of the silicon wafers is a method of bonding one silicon wafer and another silicon wafer to each other. According to the room temperature bonding method of the silicon wafers, bonding surfaces of both the silicon wafers are sputtered and etched with an inert gas ion beam or an inert gas fast atom beam in a vacuum environment at room temperature, prior to bonding.

In addition, a manufacturing method and a laminated structure are disclosed in JP 2004-358602 A (Patent Literature 2). According to the manufacturing method of the laminated structure, a donor substrate, in which a plurality of cross-section pattern members corresponding to cross-section patterns of the structure is formed, is prepared. Then, the donor substrate and a target substrate are disposed such that these substrates are faced with each other. And then, the target substrate is aligned to the cross-section pattern member and pressed to the cross-section pattern member. After that, these substrates are separated from each other. By repeating the above processing, the cross-section pattern members are transferred to the target substrate and the laminated structure, in which the cross-section patterns are laminated and bonded, is manufactured. Preparation of the donor substrate includes a first step of forming a reverse pattern layer obtained by reversing a cross-sectional pattern of the structure on the donor substrate, a second step of forming a plurality of the cross-section pattern members by plating in space portions corresponding to the cross-sectional pattern of the structure with the reverse pattern layer, and a third step of removing the reverse pattern layer.

Moreover, a room temperature bonding method is disclosed in Japanese Patent No. 4,172,806 (Patent Literature 3: corresponding to US2010/0,000,663A1). This room temperature bonding method is a method of bonding a plurality of substrates via an intermediate material at room temperature. This room temperature bonding method includes a step of forming the intermediate material on a substrate surface to be bonded by sputtering a plurality of targets physically, and a step of activating the substrate surface to be bonded by physical sputtering.

Such room temperature bonding is suitable for manufacturing the MEMS device, and it is suitable for manufacturing the semiconductor device. Therefore, in recent years, MEMS devices and semiconductor devices using the room temperature bonding apparatus has been produced, and the devices using the room temperature bonding are spreading. As a result, regarding room temperature bonding, a request for bonding different kinds of materials to each other is coming out. The different kinds of materials are, for example, different kinds of materials never bonded to each other so far, or different kinds of materials which are difficult to be bonded to each other.

Between different kinds of materials, etching rate or thickness of an oxide film and an adsorption layer is different for each material. Therefore, when etching surfaces of two wafers (substrates), which are composed of different materials from each other, under the same condition (as disclosed in Patent Literature 1), there is a case that the oxide film and the adsorption layer on each wafer surface cannot be appropriately removed and that it is difficult to bond both wafers to each other. For example, there may be a case that an oxide film on a surface of one wafer is removed and an oxide film on a surface of the other wafer is remained. Alternatively, there may be a case that an oxide film on a surface of one wafer is removed while a surface roughness of the wafer is proper and an oxide film on a surface of the other wafer is too much removed while a surface roughness of the wafer is degraded. Both of the cases, it is impossible to bond the both wafers to each other. Note that the adsorption layer is, for example, an adsorption film including contaminants deposited on a bonding target wafer (substrate) which prevent the bonding, or an inert layer such as a layer of natural oxide film to be removed. Moreover, as to different materials, it is treated as different materials, if a surface state is clearly different for each material even if the material itself is the same for each material.

In addition, in a case that forming an intermediate layer aggressively on surfaces (surfaces to be bonded) of two wafers (substrates), which are made of different materials with each other, and that the two wafers are bonded via the intermediate layer as a bonding layer, it is imagined that conditions of etching are the same for each wafer surface when the simultaneous etching of the both wafer surfaces is performed. Therefore, in this case, the oxide film and the adsorption layer on each wafer surface may not be appropriately removed as in the case of using the technic disclosed in the Patent Literature 1. As a result, it is difficult to bond both wafers to each other.

CITATION LIST

Patent Literature

Patent Literature 1: Japan Patent No. 2,791,429
Patent Literature 2: Japanese Patent Application Publication JP2004-358602A
Patent Literature 3: Japan Patent No. 4,172,806

SUMMARY OF THE INVENTION

The purpose of the present invention is providing a room temperature bonding apparatus and a room temperature bonding method, with which a plurality of substrates made of different materials can be bonded more properly.

Alternatively, the purpose of the present invention is providing a room temperature bonding apparatus and a room temperature bonding method, with which a surface is more properly activated for each substrate before a plurality of substrates made of different materials is bonded to each other.

Alternatively, the purpose of the present invention is providing a room temperature bonding apparatus and a room temperature bonding method, with which dependency on kinds of substrate materials in bonding substrates can be reduced.

A room temperature bonding apparatus of the present invention includes a first beam source, a second beam source and a press bonding mechanism. The first beam source emits a first activation beam directed onto a first surface of a first substrate. The second beam source emits a second activation beam directed onto a second surface of a second substrate. The press bonding mechanism bonds between the first substrate and the second substrate by contacting between the first surface and the second surface after the first surface is irradiated with the first activation beam and the second surface is irradiated with the second activation beam. The first irradiation which corresponds to irradiating the first surface with the first activation beam and the second irradiation which corresponds to irradiating the second surface with the second activation beam are performed independently with each other. Such room temperature bonding apparatus can irradiate the first surface and the second surface under conditions suitable for each of the first surface and the second surface as compared to other room temperature bonding apparatuses which irradiate the first surface and the second surface under the same conditions. As a result, even when the first substrate and the second substrate are made of different materials from each other, the apparatus can change states of both the first surface and the second surface to suitable surface states for bonding. Therefore the first substrate and the second substrate can be bonded more properly. Note that "first irradiation and the second irradiation are performed independently" means that the first irradiation and the second irradiation can be performed under different conditions from each other, namely, the first irradiation and the second irradiation are not necessary to be performed under the same conditions. That is, irradiation conditions of the first irradiation and irradiation conditions of the second irradiation are set independently and after that each irradiation is carried out. Note that the irradiation conditions are, for example, an irradiation period, irradiation start timing, irradiation end timing, a voltage value or a current value to be applied to electrodes of the first beam source or the second beam source, gas type, gas flow rate, density, velocity or energy of an activation beam from the first beam source or the second beam source. Therefore, the irradiation conditions of the first irradiation and the irradiation conditions of the second irradiation may be the same in all these conditions, may be the same in some conditions and may be different in the other conditions, or may be different in all these conditions. Further, the case that the first irradiation is performed under desired irradiation conditions and the second irradiation is not performed is included.

According to a room temperature bonding apparatus of the present invention, it is preferable that a first irradiation period of the first irradiation is longer than a second irradiation period of the second irradiation in some cases. With such room temperature bonding apparatus, the first surface and the second surface can be activated to the same extent even when materials of the first substrate whose first surface is activated by the first activation beam from the first beam source is more difficult to be activated (for example, oxide film or adsorption layer is relatively thick) than materials of the second substrate whose second surface is activated by the second activation beam from the second beam source. As a result, even when the materials of the first substrate and the materials of the second substrate are different materials having different surface conditions, the first substrate and the second substrate can be bonded more properly.

According to a room temperature bonding apparatus of the present invention, it is preferable that a irradiation period including the first irradiation period and the second irradiation period comprises a period during which the first irradiation and the second irradiation are performed at the same time and a period during which only one of the first irradiation or the second irradiation is performed in some cases. With such room temperature bonding apparatus, particles generated by irradiating one substrate of the first substrate or the second substrate with an activation beam can be deposited on the other substrate of the first substrate or the second substrate, which is not exposed to irradiation. Thereby, it is possible to form an intermediate layer (an adhesive layer) on the other substrate. As a result, it is possible to improve the adhesion characteristic between the first substrate and the second substrate.

According to a room temperature bonding apparatus of the present invention, it is preferable that start time of the first irradiation and start time of the second irradiation are the same with each other, or end time of the first irradiation and end time of the second irradiation are the same with each other in some cases. With such room temperature bonding apparatus, even when the bonding is performed with substrates made of different materials, the activation by the beams from the first beam source and the second beam source can be easily performed.

According to a room temperature bonding apparatus of the present invention, it is preferable that a first irradiation period or a second irradiation period is zero in some cases. With such room temperature bonding apparatus, in case that sputtering (etching) of only one substrate is sufficient to bond different materials to each other, it is possible to reduce power of energy.

According to a room temperature bonding apparatus of the present invention, it is preferable that the apparatus further includes a control apparatus in some cases. The control apparatus controls the first beam source and the second beam source such that irradiating the first surface with the first activation beam and irradiating the second surface with the second activation beam are performed independently with each other. Such room temperature bonding apparatus can irradiates the first surface and the second surface under adequate irradiation conditions, respectively. As a result, even when the materials of the first substrate and the material of the second substrate are different materials, the apparatus can change the states of both the first surface and the second surface to suitable surface states. Therefore, the first substrate and the second substrate can be bonded more properly.

According to a room temperature bonding apparatus of the present invention, it is preferable that the control apparatus controls the first beam source and the second beam source such that the first activation beam and the second activation beam are different from each other in some cases. Such room temperature bonding apparatus can generate particles by irradiating one substrate of the first substrate or the second substrate with an activation beam, and deposit the generated particles on the other substrate of the first substrate or the second substrate, which is exposed to, for example, an activation beam with relatively small energy (including zero energy). Thereby, an intermediate layer (an adhesion layer) is formed on the other substrate. As a result, it is possible to improve the adhesion characteristic between the first substrate and the second substrate. Note that "the first activation beam and the second activation beam are different" means "the first activation beam and the second activation beam are different in activation beam density, speed of activation beam, kinds of atom constituting activation beam or energy of activation beam".

A room temperature bonding method of the present invention includes: irradiating a first surface of a first substrate with a first activation beam; irradiating a second surface of a second substrate with a second activation beam; and bonding between the first substrate and the second substrate by contacting between the first surface and the second surface after the first surface is irradiated with the first activation beam and the second surface is irradiated with the second activation beam. In this method, first irradiation which corresponds to irradiating the first surface with the first activation beam and second irradiation which corresponds to irradiating the second surface with the second activation beam are performed independently with each other. Such room temperature bonding method can irradiate the first surface and the second surface under conditions suitable for each of the first surface and the second surface as compared to other room temperature bonding apparatuses which irradiate the first surface and the second surface under the same conditions. As a result, even when the first substrate and the second substrate are made of different materials from each other, the method can change states of both the first surface and the second surface to suitable surface states for bonding. Therefore, the first substrate and the second substrate can be bonded more properly.

According to a room temperature bonding method of the present invention, it is preferable that a first irradiation period of the first irradiation is longer than a second irradiation period of the second irradiation in some cases. With such room temperature bonding method, the first surface and the second surface can be activated to the same extent even when materials of the first substrate whose first surface is activated by the first activation beam from the first beam source is more difficult to be activated than materials of the second substrate whose second surface is activated by the second activation beam from the second beam source. As a result, even when the materials of the first substrate and the materials of the second substrate are different materials having different surface conditions, the first substrate and the second substrate can be bonded more properly.

According to a room temperature bonding method of the present invention, it is a preferable that a irradiation period including the first irradiation period and the second irradiation period comprises a period during which the first irradiation and the second irradiation are performed at the same time and a period during which only one of the first irradiation or the second irradiation is performed in some cases. With such room temperature bonding method, particles generated by irradiating one substrate of the first substrate or the second with an activation beam can be deposited on the other substrate of the first substrate or the second substrate, which is not exposed to irradiation. Thereby, it is possible to form an intermediate layer (an adhesive layer) on the other substrate. As a result, it is possible to improve the adhesion characteristic between the first substrate and the second substrate.

According to a room temperature bonding method of the present invention, it is a preferable that start time of the first irradiation and start time of the second irradiation are the same with each other, or end time of the first irradiation and end time of the second irradiation are the same with each other in some cases. With such room temperature bonding method, even when the bonding is performed with substrates made of different materials, the activation by the beams from the first beam source and the second beam source can be easily performed.

According to a room temperature bonding method of the present invention, it is preferable that the first irradiation period or the second irradiation period is zero in some cases. With such room temperature bonding method, in case that sputtering (etching) of only one substrate is sufficient to bond different materials to each other, it is possible to reduce power of energy.

According to a room temperature bonding method of the present invention, it is preferable that the first activation beam and the second activation beam are different from each other in some cases. Such room temperature bonding method can generate particles by irradiating one substrate of the first substrate or the second substrate with an activation beam, and deposit the generated particles on the other substrate of the first substrate or the second substrate, which is exposed to, for example, an activation beam with relatively small energy (including zero energy). Thereby, an intermediate layer (an adhesion layer) is formed on the other substrate. As a result, it is possible to improve the adhesion characteristic between the first substrate and the second substrate.

The room temperature bonding apparatus and the room temperature bonding method of the present invention may bond a plurality of substrates made of different materials more properly. The apparatus and the method may properly activate each substrate before bonding a plurality of substrates made of different materials to each other. The apparatus and the method may reduce dependency on kinds of substrate materials in bonding substrates.

DESCRIPTION OF EMBODIMENTS

Figure 1:
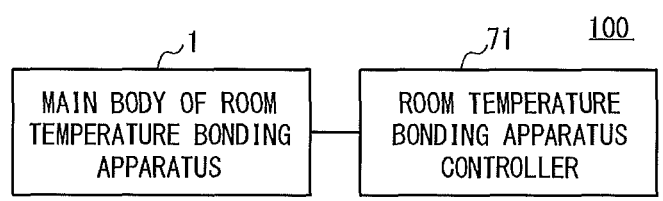
FIG. 1 is a block diagram indicating a configuration of a room temperature bonding apparatus according to some embodiments.

Referring to the drawings, room temperature bonding apparatuses and room temperature bonding methods are explained.

First Embodiment

At First, a configuration of a room temperature bonding apparatus according to the first embodiment is explained. FIG. 1 is a block diagram indicating a configuration of the room temperature bonding apparatus according to the present embodiment. The room temperature bonding apparatus 100 includes the room temperature bonding apparatus main body 1 for carrying out room temperature bonding, and a room temperature bonding apparatus controller 71 for controlling the room temperature bonding apparatus main body.

Figure 2:
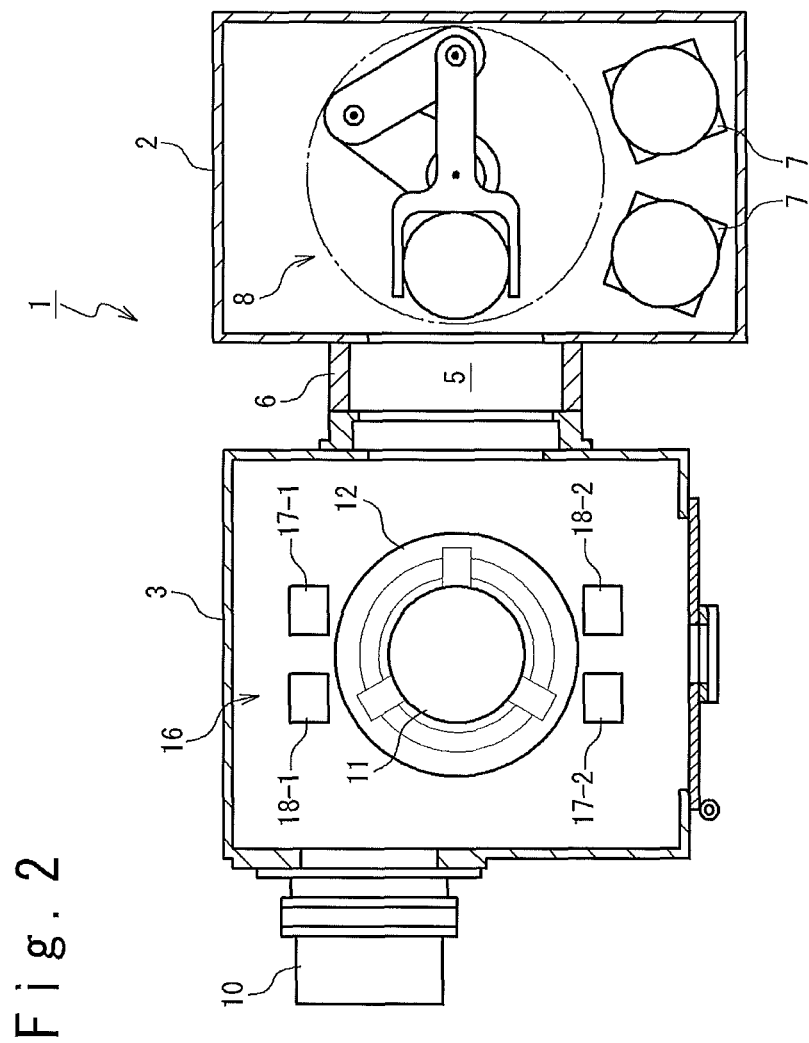
FIG. 2 is a cross-sectional view of a main body of the room temperature bonding apparatus according to some embodiments.

FIG. 2 is a cross-sectional view of the main body 1 of the room temperature bonding apparatus according to the present embodiment. The room temperature bonding apparatus main body 1 includes a load lock chamber 2 and a bonding chamber 3. The load lock chamber 2 includes a vessel sealing an inner space from the external environment. The room temperature bonding apparatus main body 1 further includes a gate 5 and a gate valve 6. The gate 5 is disposed between the load lock chamber 2 and the bonding chamber 3, and which connects an inner space of the bonding chamber 3 to the inner space of the load lock chamber 2. The gate valve 6 is controlled by the room temperature bonding apparatus controller 71 to close the gate 5 or to open the gate 5.

The load lock chamber 2 includes a lid and a vacuum exhaust device (not shown). The lid closes an opening (not shown) for connecting the external environment and the inner space of the load lock chamber 2 or opens the opening by the user's operation. The vacuum exhaust device is controlled by the room temperature bonding apparatus controller 71 to exhaust gas from the inner space of the load lock chamber 2 when the opening and the gate 5 are closed.

The load lock chamber 2 further includes a plurality of shelves 7 and the transfer robot 8 therein. A plurality of cartridges is placed on the shelves 7. Each cartridge is formed in an approximately disk shape. The cartridge is used while the wafer is placed thereon. The transfer robot 8 is controlled by the room temperature bonding apparatus controller 71 to transfer a cartridge placed on one of the plurality of shelves 7 to an inside of the bonding chamber 3 or transfer the cartridge disposed inside the bonding chamber to one of the plurality of shelves 7.

The bonding chamber 3 includes a vacuum exhaust device 10. The vacuum exhaust device 10 is controlled by the room temperature bonding apparatus controller 71 to exhaust gas from the inner space of the bonding chamber 3 when the gate 5 is closed.

Figure 3:
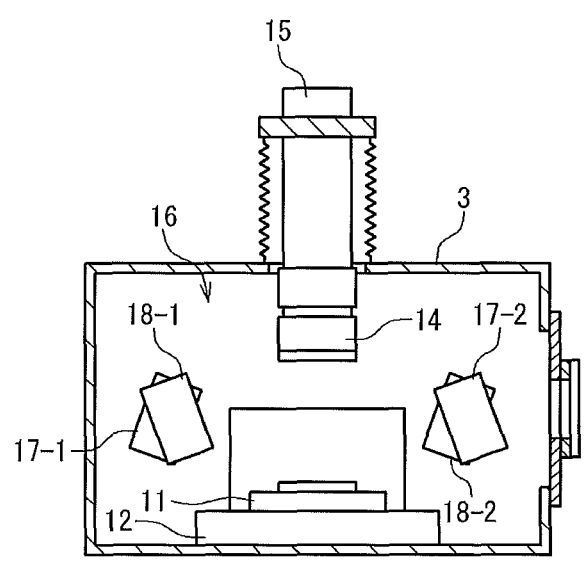
FIG. 3 is a cross-sectional view of a bonding chamber according to some embodiments.

FIG. 3 is a cross-sectional view of the bonding chamber 3 according to the present embodiment. The bonding chamber 3 further includes a positioning stage carriage 11 and a positioning mechanism 12. The positioning stage carriage 11 is formed in a plate shape. The positioning stage carriage 11 is disposed in the bonding chamber 3. The positioning stage carriage is supported by the bonding chamber so as to be movable parallel to the horizontal direction and rotatable around a rotational axis parallel to the vertical direction. The positioning stage carriage 11 supports a wafer (or a substrate) 42 by holding the cartridge on which the wafer (or substrate) is placed. The positioning mechanism 12 is controlled by the room temperature bonding apparatus controller 71 to move the positioning stage carriage 11 such that the positioning stage carriage 11 moves in a direction parallel to the horizontal direction or rotates about the rotation axis parallel to the vertical direction.

The bonding chamber 3 further includes an electrostatic chuck 14 and a press bonding mechanism 15. The electrostatic chuck 14 is disposed inside the bonding chamber 3 and vertically above the positioning stage carriage 11. The electrostatic chuck 14 is supported movably parallel to the vertical direction by the bonding chamber 3. The electrostatic chuck 14 has a dielectric layer. The electrostatic chuck 14 has a flat surface which is approximately perpendicular to the vertical direction at the lower end. The electrostatic chuck 14 further includes an internal electrode disposed inside the dielectric layer. The electrostatic chuck 14 is controlled by the room temperature bonding apparatus controller 71 to apply predetermined voltage to the internal electrode. By applying predetermined voltage to the internal electrode, the electrostatic chuck 14 holds the wafer (or the substrate) 52 arranged in the vicinity of the flat surface of the dielectric layer by electrostatic forces.

The Press bonding mechanism 15 is controlled by the room temperature bonding apparatus controller 71 to move electrostatic chuck 14 with respect to the bonding chamber 3 in a direction parallel to the vertical direction. For example, the press bonding mechanism 15 is controlled by the room temperature bonding apparatus controller 71 to place the electrostatic chuck 14 at one position of a plurality of positions. The plurality of positions includes an alignment position, a home position and an activation position. Its alignment position is set such that a lower side wafer 42 and an upper side wafer 52 are separated from each other with a predetermined distance (e.g. 1 mm), when the lower side wafer 42 is held on the positioning stage carriage 11 and the upper side wafer 52 is held on the electrostatic chuck 14. Its home position is set more upward in the vertical direction from the alignment position. Its activation position is set more upward in the vertical direction from the home position.

The pressure bonding mechanism 15 is further controlled by the room temperature bonding apparatus controller 71 to measure a position of the electrostatic chuck 14 and output the measured position to the room temperature bonding apparatus controller 71. The pressure bonding mechanism 15 is further controlled by the room temperature bonding apparatus controller 71 to measure a load applied to the wafer 52 held by the electrostatic chuck 14 and output the measured load to the room temperature bonding apparatus controller 71.

Bonding chamber 3 further includes an activation device 16. The activation device 16 includes a plurality of lower side atomic beam sources 17-1 to 17-2 and a plurality of upper side atomic beam sources 18-1 to 18-2. Each of the plurality of lower side atomic beam sources 17-1 to 17-2 is disposed via a mounting position adjusting mechanism (not shown) in the bonding chamber 3. The plurality of lower side atomic beam sources 17-1 to 17-2 is used to activate a surface of the wafer 42 on the positioning stage carriage 11. Each of the plurality of upper side atomic beam sources 18-1 to 18-2 is disposed via a mounting position adjusting mechanism (not shown) in the bonding chamber 3. The plurality of upper side atomic beam sources 18-1 to 18-2 is used to activate a surface of the wafer 52 on the electrostatic chuck 14. The mounting position adjusting mechanisms, respectively, can adjust irradiation angle of the activation beam from corresponding lower side atomic beam source 17-i or corresponding upper side atomic beam source 18-i. Note that the number of the lower side atomic beam sources 17-1 to 17-2 and the number of the upper side atomic beam sources 18-1 to 18-2, respectively, is two in the example. However the number of the lower side atomic beam sources 17-1 to 17-2 and the number of the upper side atomic beam sources 18-1 to 18-2, respectively, is not limited to two.

Figure 4:
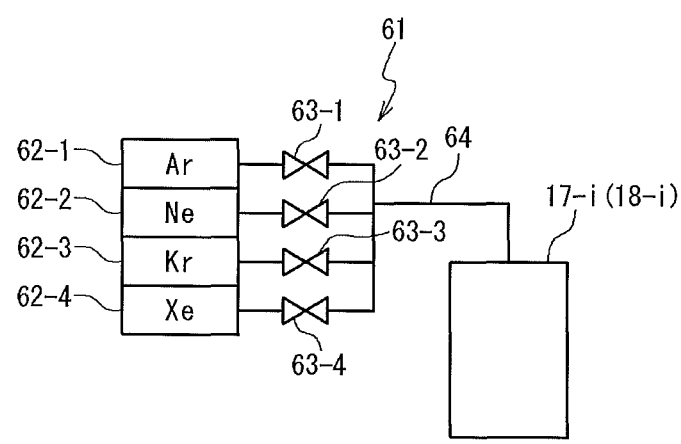
FIG. 4 is a block diagram indicating a gas type switching mechanism.

The room temperature bonding apparatus main body 1 further includes a plurality of gas type switching mechanisms corresponding to the plurality of lower side atomic beam sources 17-1 to 17-2 and the plurality of upper side atomic beam sources 18-1 to 18-2, respectively. A gas type switching mechanisms of the plurality of gas type switching mechanisms, which corresponds to the lower side atomic beam source 17-i (i=1,2), is controlled by the room temperature bonding apparatus controller 71 to supply predetermined gas to the lower side atomic beam source 17-i. FIG. 4 is a block diagram indicating the gas type switching mechanism. The gas type switching mechanism 61 includes a plurality of gas supply devices 62-1 to 62-4, a plurality of valves 63-1 to 63-4 and a conduit 64. The plurality of gas supply devices 62-1 to 62-4 is located outside the bonding chamber 3. The plurality of gas supply devices 62-1 to 62-4 includes, for example, a plurality of gas cylinders which supplies different kinds of gases, respectively. For example, the gas supply devices 62-1 to 62-4, respectively, supply argon gas Ar, neon gas Ne, krypton gas Kr or xenon gas Xe. The plurality of valves 63-1 to 63-4 is located outside the bonding chamber 3. An arbitrary valve 63-k of the valves 63-1 to 63-4 (k=1, 2, 3, 4) is controlled by the room temperature bonding apparatus controller 71 to supply gas supplied from the gas supply device 62-k to the conduit 64 or stop supplying the gas to the conduit 64. The conduit 64 connects between the plurality of valves 63-1 to 63-4 and the lower side atomic beam source 17-i such that the lower side atomic beam source 17-i receives the gas supplied from the plurality of valves 63-1 to 63-4 to the conduit 64. In this case, the lower side atomic beam source 17-i is controlled by the room temperature bonding apparatus controller 71 to irradiate a fast atom beam generated using the supplied gas from the gas type switching mechanism 61.

Like the lower side atomic beam source 17-i, the upper side atomic beam source 18-i includes other gas type switching mechanism 61. The gas type switching mechanism 61 is configured as shown in FIG. 4, and controlled by the room temperature bonding apparatus controller 71 to supply predetermined gas to the upper side atomic beam source 18-i. In this case, the upper side atomic beam source 18-i is controlled by the room temperature bonding apparatus controller 71 to irradiate a fast atom beam generated using the supplied gas from the gas type switching mechanism 61.

Figure 5:
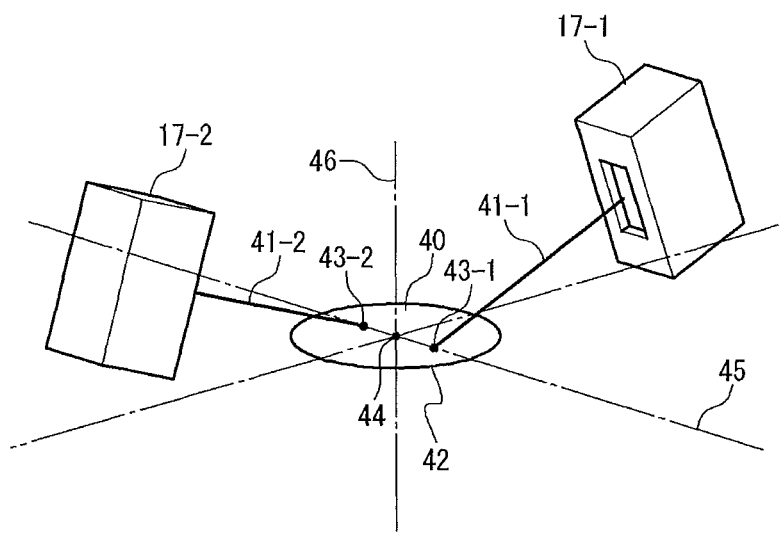
FIG. 5 is a perspective view indicating a plurality of lower side beam sources according to some embodiments.

FIG. 5 is a perspective view indicating the plurality of lower side atomic beam sources 17-1 to 17-2 according to the present embodiment. An arbitrary lower side atomic beam source 17-i of the plurality of lower side atomic beam sources 17-1 to 17-2 is controlled by the room temperature bonding apparatus controller 71 to supply the fast atom beam (FAB: FAST ATOM BEAM) generated using the supplied gas from the gas type switching mechanism 61 and emit the fast atom beam along a irradiation axis 41-i. The irradiation axis 41-i passes through an approximate center of the irradiation hole of the lower side atomic beam source 17-i, and is approximately perpendicular to a plane of the irradiation hole of the lower side atomic beam source 17-i. It is possible that the plurality of lower side atomic beam sources 17-1 to 17-2 is further controlled independently from each other by the room temperature bonding apparatus controller 71 such that a first fast atom beam emitted from the lower side atomic beam source 17-1 and a second fast atom beam emitted from the lower side atomic beam source 17-2 are different from each other. Note that "fast atom beams are different from each other" means that the fast atom beams are different in beam density, beam speed, kinds of atom constituting the beam or energy of the beam. In addition, it may mean that the fast atom beams are different in, for example, a period of irradiation of the beam, start timing of the irradiation, or end timing of the irradiation.

The positioning stage carriage 11 holds the lower side wafer 42 in the bonding chamber 3 such that a surface 40 to be activated of the lower side wafer 42 is facing vertically upward, by holding the cartridge on which the lower side wafer 42 is placed. The substrate made of the optimum materials such as a metal material, a semiconductor material and an insulating material is selected depending on a device to be manufactured as the lower side wafer 42. For example, the lower side wafer 42 is made of, for example, a single crystal of silicon, sapphire etc., and is formed in a disc shape. The lower side wafer 42 has a plurality of patterns on the surface 40 to be activated. Note that the lower side wafer 42 may be replaced with a substrate which is not formed in a disc shape. Such a substrate is formed in, for example, a rectangular plate. The lower side atomic beam source 17-i is fixed on the bonding chamber 3 such that the irradiation axis 41-i intersects with the surface 40 to be activated at an intersection point 43-i when the lower side wafer 42 is held by the positioning stage carriage 11.

The plurality of lower side atomic beam sources 17-1 to 17-2 is disposed such that the intersection point 43-1 and the intersection point 43-2 are deferent in position, and also that the middle point of a line segment connecting the intersection point 43-1 and the intersection point 43-2 is arranged at the center 44 of the surface 40 to be activated. In addition, the plurality of lower side atomic beam sources 17-1 to 17-2 is disposed such that a straight line 45 which passes through both the intersection point 43-1 and the intersection point 43-2 is perpendicular to both the irradiation axis 41-1 and the irradiation axis 41-2. Moreover, the plurality of lower side atomic beam sources 17-1 to 17-2 is disposed such that a distance between the irradiation hole of the lower side atomic beam source 17-1 and the intersection point 43-1 is equal to a distance between the irradiation hole of the lower side atomic beam source 17-2 and the intersection point 43-2. That is, the plurality of lower side atomic beam sources 17-1 to 17-2 has two-fold rotational symmetry with respect to a main rotating axis 46. The main rotating axis 46 is an axis passing through the center 44 and perpendicular to the surface 40 to be activated. That is, the plurality of lower side atomic beam sources 17-1 to 17-2 is arranged such that when the lower side atomic beam source 17-1 is rotated about the main rotating axis 46 by 180 degrees (½ turn), the lower side atomic beam source 17-1 overlaps the lower side atomic beam source 17-2.

Figure 6:
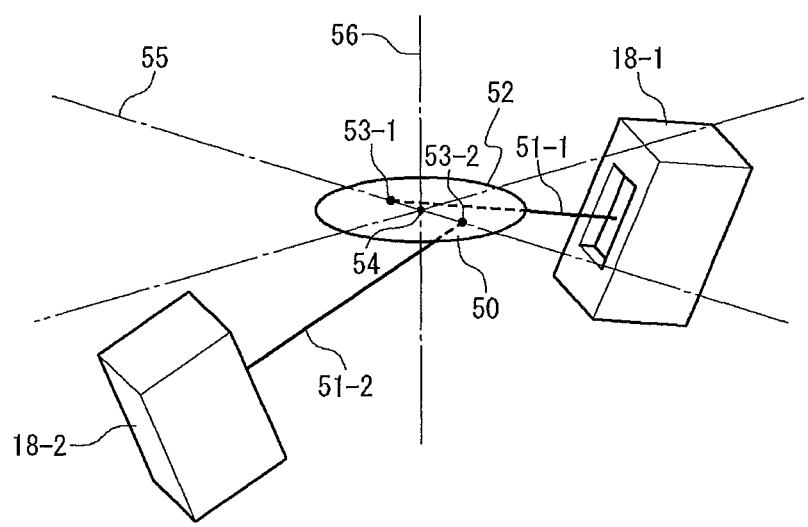
FIG. 6 is a perspective view indicating a plurality of upper side beam sources according to some embodiments.

FIG. 6 is a perspective view indicating the plurality of upper side atomic beam sources 18-1 to 18-2 according to the present embodiment. An arbitrary upper side atomic beam source 18-*i* of the plurality of upper side atomic beam sources 18-1 to 18-2 is controlled by the room temperature bonding apparatus controller 71 to supply the fast atom beam (FAB) generated using the supplied gas from the gas type switching mechanism 61 and emit the fast atom beam along a irradiation axis 51-*i*. The irradiation axis 51-*i* passes through an approximate center of the irradiation hole of the upper side atomic beam source 18-*i*, and is approximately perpendicular to a plane of the irradiation hole of the upper side atomic beam source 18-*i*. It is possible that the plurality of upper side atomic beam sources 18-1 to 18-2 is further controlled independently from each other by the room temperature bonding apparatus controller 71 such that a first fast atom beam emitted from the upper side atomic beam source 18-1 and a second fast atom beam emitted from the upper side atomic beam source 18-2 are different from each other. Note that "fast atom beams are different from each other" has above mentioned meaning.

The electrostatic chuck 14 holds the upper side wafer 52 in the bonding chamber 3 such that a surface 50 to be activated of the upper side wafer 52 is facing vertically downward. The substrate made of the optimum materials such as a metal material, a semiconductor material and an insulating material is selected depending on the device to be manufactured as the upper side wafer 52. For example, the upper side wafer 52 is made of, for example, a single crystal of silicon, sapphire etc., and formed in a disc shape. The upper side wafer 52 has a plurality of patterns on the surface 50 to be activated. Note that the upper side wafer 52 may be replaced with a substrate which is not formed in a disc shape. Such a substrate is formed in, for example, a rectangular plate. The upper side atomic beam source 18-*i* is fixed on the bonding chamber 3 such that the irradiation axis 51-*i* intersects with the surface 50 to be activated at an intersection point 53-*i* when the upper side wafer 52 is held by the electrostatic chuck 14 and the electrostatic chuck 14 is positioned at the activation position.

The plurality of upper side atomic beam sources 18-1 to 18-2 is disposed such that the intersection point 53-1 and the intersection point 53-2 are deferent in position, and also that the middle point of a line segment connecting the intersection point 53-1 and the intersection point 53-2 is arranged at the center 54 of the surface 50 to be activated. In addition, the plurality of upper side atomic beam sources 18-1 to 18-2 is disposed such that a straight line 55 which passes through both the intersection point 53-1 and the intersection point 53-2 is perpendicular to both the irradiation axis 51-1 and the irradiation axis 51-2. Moreover, the plurality of upper side atomic beam sources 18-1 to 18-2 is disposed such that a distance between the irradiation hole of the upper side atomic beam source 18-1 and the intersection point 53-1 is equal to a distance between the irradiation hole of the upper side atomic beam source 18-2 and the intersection point 53-2. That is, the plurality of upper side atomic beam sources 18-1 to 18-2 has two-fold rotational symmetry with respect to a main rotating axis 56. The main rotating axis 56 is an axis passing through the center 54, perpendicular to the surface 50 to be activated, and equal to the rotating axis 46 in position. That is, the plurality of upper side atomic beam sources 18-1 to 18-2 is arranged such that when the upper side atomic beam source 18-1 is rotated about the main rotating axis 56 by 180 degrees (½ turn), the upper side atomic beam source 18-1 overlaps the upper side atomic beam source 18-2.

The activation device 16, whose plurality of the lower side atomic beam sources 17-1 to 17-2 is arranged rotation-symmetrically about the main rotation axis 46, can irradiate the surface 40 to be activated more uniformly with the fast atom beam and more uniformly etch the surface 40 to be activated as compared to another activation device whose plurality of lower side atomic beam sources 17-1 to 17-2 is not arranged rotation-symmetrically. Similarly, the activation device, whose plurality of the upper side atomic beam sources 18-1 to 18-2 is arranged rotation-symmetrically about the main rotation axis 56, can irradiate the surface 50 to be activated more uniformly with the fast atom beam and more uniformly etch the surface 40 to be activated as compared to another activation device whose plurality of upper side atomic beam sources 18-1 to 18-2 is not arranged rotation-symmetrically.

In addition, the main body 1 of the room temperature bonding apparatus with the plurality of lower side atomic beam sources 17-1 to 17-2 and the plurality of upper side atomic beam sources 18-1 to 18-2 can irradiate wider area more uniformly as compared to another room temperature bonding apparatus with one fixed lower side atomic beam source and one fixed upper side atomic beam source. Therefore, the main body 1 of the room temperature bonding apparatus can activate the entire surface of a larger substrate and the larger substrate can be bonded more properly by the main body 1 of the room temperature bonding apparatus.

Figure 7:
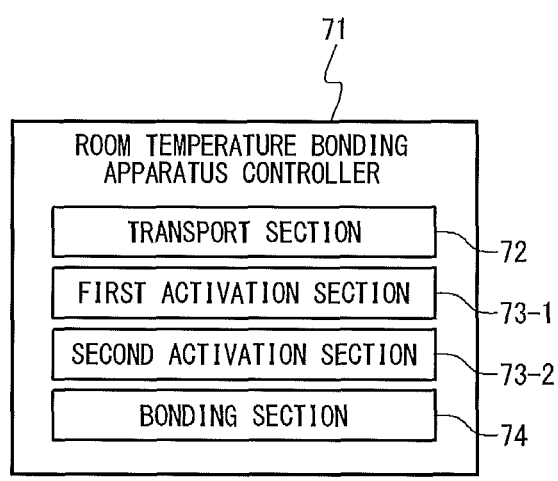
FIG. 7 is a block diagram indicating a configuration of a room temperature bonding apparatus controller.

FIG. 7 is a block diagram indicating a configuration of the room temperature bonding apparatus controller according to the present embodiment. The room temperature bonding apparatus controller 71 is a computer, and includes a CPU, a storage unit and an interface (not shown). The CPU controls the storage unit and the interface by executing a computer program that is installed in the room temperature bonding apparatus controller 71. The storage unit stores the computer program and temporarily stores information created by the CPU.

The interface may output information created by a plurality of external devices connected to the room temperature bonding apparatus controller 71 to the CPU and output information created by the CPU to the plurality of external devices. The plurality of external devices is, for example, an input device, an output device, a communication device, and a removable memory drive. The input device creates information by user's operation, and outputs the information to the CPU. The input device is, for example, a keyboard, a pointing device, and a touch panel. The output device outputs the information created by the CPU such that the user can recognize the information. The output device is, for example a display, an acoustic device, and a touch panel. The communication device sends the information created by the CPU to another computer via communication network and output information received from another computer via the communication network to the CPU, when the room temperature bonding apparatus controller 71 is connected to the communication network. Moreover, the communication device is utilized to download the computer program to be installed in the room temperature bonding apparatus controller 71 from another computer. The removable memory drive is utilized to read the data recorded on a recording medium, when the recording medium is inserted therein. Moreover, the removable memory drive is utilized to install the computer program in the room temperature bonding apparatus controller 71, when the recording medium having the computer program is inserted therein. The recording medium is, for example, a magnetic disk (flexible disk, hard disk), an optical disk (CD, DVD), a magneto-optical disk, and a flash memory.

In addition, the interface connects the main body 1 of the room temperature bonding apparatus to the room temperature bonding device controller 71. More specifically, the interface connects the gate valve 6, the transfer robot 8, the vacuum exhaust device which exhausts gas from the load lock chamber 2, the vacuum exhaust device 10, the positioning mechanism 12, the electrostatic chuck 14, the press bonding mechanism 15, the plurality of lower side atomic beam sources 17-1 to 17-2, the plurality of upper side atomic beam sources 18-1 to 18-2 and the plurality of valves 63-1 to 63-4 to the room temperature bonding device controller 71.

The computer program installed in the room temperature bonding apparatus controller 71 includes a plurality of computer programs causing the room temperature bonding apparatus controller 71 to perform a plurality of functions, respectively. The plurality of functions are performed by a transport section 72, a first activation section 73-1, a second activation section 73-2 and a bonding section 74.

The transport section 72 controls the main body 1 of the room temperature bonding apparatus with respect to transferring the wafer, placing the wafer, and picking out the wafer. More specifically, the transport section 72 mainly controls the vacuum exhaust device in the load lock chamber 2, the gate valve 6 to open or close, the transfer robot 8 to transfer cartridges, the press bonding mechanism 15 and the electrostatic chuck 14.

The first activation section 73-1 and the second activation section 73-2 control the main body 1 of the room temperature bonding apparatus with respect to activating wafers. More specifically, the first activation section 73-1 and the second activation section 73-2 mainly controls the vacuum exhaust device 10 in the bonding chamber 3, the gas type switching mechanism 61, the press bonding mechanism 15, the plurality of upper side atomic beam sources 18-1 to 18-2 and the plurality of lower side atomic beam sources 17-1 to 17-2.

The bonding section 74 controls the main body 1 of the room temperature bonding apparatus with respect to bonding the wafers. More specifically, the bonding section 74 mainly controls the press bonding mechanism 15, the electrostatic chuck 14 and the positioning mechanism 12.

Figure 8:
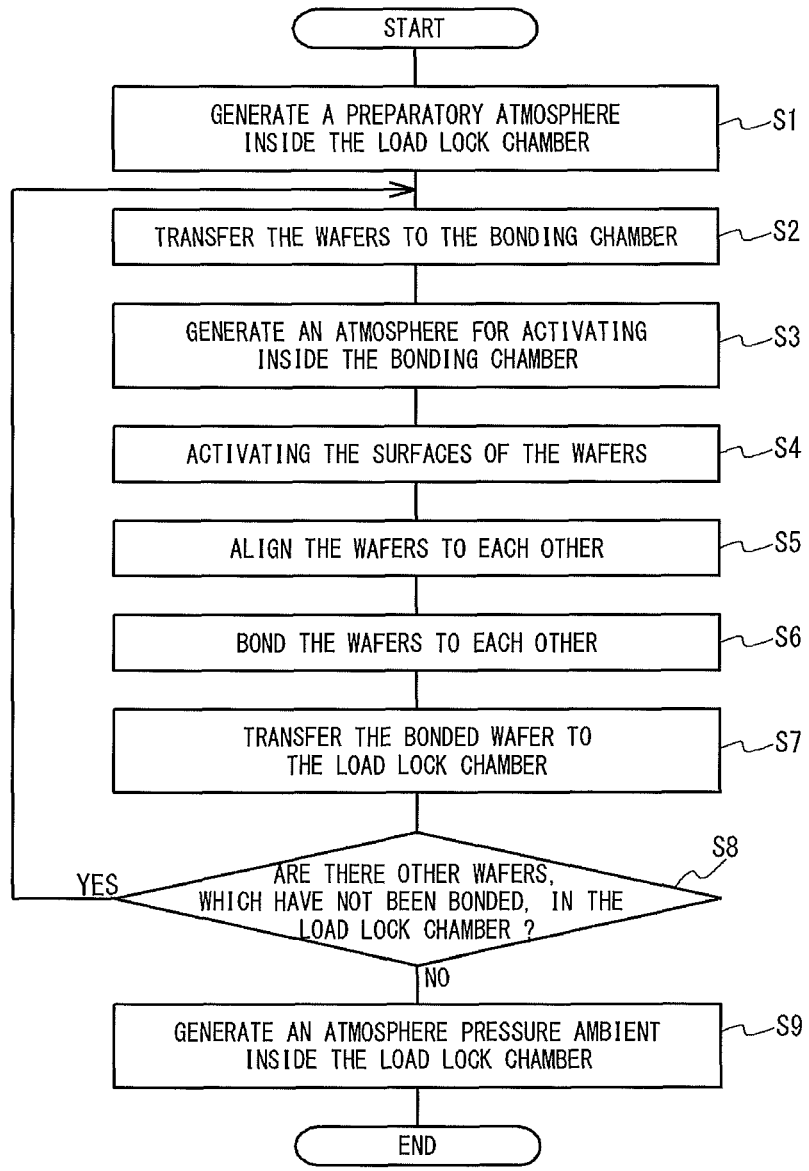
FIG. 8 is a flow chart indicating a method of room temperature bonding method according to some embodiments.

Next, the room temperature bonding method (the operation of the room temperature bonding apparatus) according to the first embodiment will be explained. FIG. 8 is a flow chart indicating a method of room temperature bonding method according to the present embodiment. This room temperature bonding method is performed using the room temperature bonding apparatus 100 described above.

The transport section 72 of the room temperature bonding apparatus controller 71, firstly, controls the gate valve 6 to close the gate 5. The transport section 72 controls the vacuum exhaust device in the load lock chamber 2 to generate an atmospheric pressure ambient inside the load lock chamber 2 and controls the vacuum exhaust device 10 to generate an atmosphere for bonding inside the bonding chamber 3, when the gate 5 is closed.

The user prepares a plurality of lower side wafers, a plurality of upper side wafers, a plurality of lower side cartridges and a plurality of upper side cartridges. The plurality of lower side wafers includes the lower side wafer 42. The plurality of upper side wafers includes the upper side wafer 52. The plurality of lower side cartridges is corresponding to the plurality of lower side wafers, respectively. The plurality of upper side cartridges is corresponding to the plurality of upper side wafers, respectively. The user, then, opens a lid of the load lock chamber 2 and places the plurality of the lower side cartridges and the plurality of the upper side cartridges inside a plurality of shelves 7, when the atmospheric pressure ambient is generated inside the load lock chamber 2. The lower side wafer 42 is placed on the lower side cartridge corresponding to the lower side wafer 42 among the plurality of lower side cartridges such that the back of the wafer 42, which is opposite to the surface 40 to be activated, faces the lower side cartridge. The upper side wafer 52 is placed on the upper side cartridge corresponding to the upper side wafer 52 among the plurality of upper side cartridges such that the surface 50 to be activated faces the upper side cartridge.

The user closes the lid of the load lock chamber 2 after the plurality of the lower side cartridges and the plurality of the upper side cartridges are placed inside the plurality of shelves 7. The transport section 72 controls the vacuum exhaust device in the load lock chamber 2 to generate a preparatory atmosphere inside the load lock chamber 2 when the lid of the load lock chamber 2 is closed (step S1).

The transport section 72 controls the gate valve 6 to open the gate 5 when the preparatory atmosphere is generated inside the load lock chamber 2. The transport section 72 controls the transfer robot 8 to transfer the upper side cartridge from the plurality of shelves 7 to the positioning stage carriage 11 such that the upper side wafer 52 is held by the positioning stage carriage 11 in the bonding chamber 3 when the gate 5 is open. The transport section 72 controls the press bonding mechanism 15 to lower the electrostatic chuck 14 when the upper side wafer 52 is held by the positioning stage carriage 11. The transport section 72 controls the press bonding mechanism 15 to measure a load applied to the electrostatic chuck 14 when the electrostatic chuck 14 moves downward. The transport section 72 calculates the timing at which the load reaches a predetermined contact force based on a change of the load, that is, the timing at which the upper side wafer 52 resting on the upper side cartridge contacts to the electrostatic chuck 14 based on the change of the load. The transport section 72 controls the press bonding mechanism 15 to stop lowering the electrostatic chuck 14 at that timing.

The transport section 72 controls the electrostatic chuck 14 to hold the upper side wafer 52 by the electrostatic chuck 14 when the electrostatic chuck 14 is in contact with the upper side wafer 52. The transport unit 72 controls the press bonding mechanism 15 to raise the electrostatic chuck 14 until the electrostatic chuck 14 reaches the home position when the upper side wafer 52 is held by the electrostatic chuck 14. The transport section 72 controls the transfer robot to transfer the upper side cartridge from the positioning stage carriage 11 to the plurality of shelves 7 after the electrostatic chuck 14 is located at the home position.

The transport section 72 controls the transfer robot 8 to transfer the lower side cartridge from the plurality of shelves 7 to the positioning stage carriage 11 such that the lower side wafer 42 is held by the positioning stage carriage 11 in the bonding chamber 3 after the upper side cartridge is transferred to the plurality of shelves 7. The transport section 72 controls the gate valve 6 to close the gate 5 after the lower side cartridge is held by the positioning stage carriage 11 (step S2).

The first activation section 73-1 and the second activation section 73-2 of the room temperature bonding apparatus controller 71 control the press bonding mechanism 15 to raise the electrostatic chuck 14 until the electrostatic chuck 14 reaches the activation position and control the vacuum exhaust device 10 to generate an atmosphere for activating inside the bonding chamber 3 when the gate 5 is closed (step S3). The first activation section 73-1 and the second activation section 73-2 further control the activation device 16 to activate the entire surface 50 to be activated of the upper side wafer 52 and the entire surface 40 to be activated of the lower side wafer 42 when the atmosphere for activating is generated inside the bonding chamber 3 (step S4). The specific method of activation is described later.

The bonding section 74 of the room temperature bonding apparatus controller 71 controls the press bonding mechanism 15 to lower the electrostatic chuck 14 to the alignment position after the surface 40 of the lower side wafer 42 is activated and the surface 50 of the upper side wafer 52 is activated. The bonding section 74 controls the positioning mechanism 12 to arrange the lower side wafer 42 at predetermined alignment position with respect to the upper side wafer 52 when the upper side wafer 52 and the lower side wafer 42 are separated from each other with the alignment distance (step S5).

The bonding section 74 controls the press bonding mechanism 15 to lower the electrostatic chuck 14 after the lower side wafer 42 is positioned at the alignment position. The bonding section 74 controls the press bonding mechanism 15 to measure a load applied to the electrostatic chuck 14 when the electrostatic chuck 14 moves downward. The bonding section 74 calculates the timing at which the load reaches a predetermined bonding load. The bonding section 74 controls the press bonding mechanism 15 to stop lowering the electrostatic chuck 14 at that timing, namely, the bonding section 74 controls the press bonding mechanism 15 to apply the bonding load to the upper side wafer 52 and the lower side wafer 42. The lower side wafer 42 and the upper side wafer 52 are bonded by applying the bonding load and one bonded wafer is formed.

The bonding section 74 controls the electrostatic chuck 14 to separate the bonded wafer from the electrostatic chuck 14 after the bonding load is applied to the bonded wafer during a predetermined bonding period. The bonding section 74 controls the press bonding mechanism 15 to raise the electrostatic chuck 14 after the bonded wafer is separated from the electrostatic chuck 14. The transport section 72 controls the gate valve 6 to open the gate 5, after the electrostatic chuck 14 is sufficiently raised. The transport section 72 controls the transfer robot 8 to transfer the lower side cartridge from the positioning stage carriage 11 to the plurality of shelves 7 so as to transfer the bonded wafer to the load lock chamber 2, when the gate 5 is open (step S7).

The transport section 72 repeatedly executes the operations of steps S2 to step S7, when another lower side cartridge, on which a lower side wafer is placed, of the plurality of lower side cartridges and another upper side cartridge, on which an upper side wafer is placed, of the plurality of upper side cartridges exist in the plurality of shelves 7 (step S8, YES).

The transport section 72 controls the gate valve 6 to close the gate 5, when any lower side wafers and any upper side wafers scheduled to be bonded do not exists in the plurality of shelves 7 (step S8, NO). The transport section 72 controls the vacuum exhaust device in the load lock chamber 2 to generate the atmospheric pressure ambient inside the load lock chamber 2 after the gate 5 is closed (step S9). The user opens the lid of the load lock chamber 2 and picks out a plurality of bonded wafers including said bonded wafer from the load lock chamber 2 by picking out the plurality of the lower side cartridges and the plurality of the upper side cartridges from the plurality of shelves 7, after the atmospheric pressure ambient is generated inside the load lock chamber 2.

When the user further desires to bond another plurality of lower side wafers and another plurality of upper side wafers, the user prepares a plurality of lower side cartridges corresponding to the plurality of lower side wafers and a plurality of upper side cartridges corresponding to the plurality of upper side wafers and performs above mentioned room temperature bonding method again.

Figure 9:
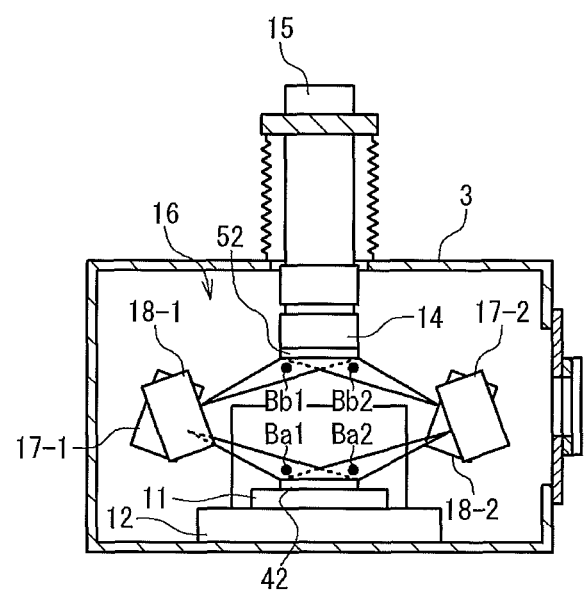
FIG. 9 is a cross-sectional view of the bonding chamber in which an activation process is in operation according to some embodiments.

Next, a method of activating the surface of the wafer (step S4) will be explained. FIG. 9 is a cross-sectional view of the bonding chamber in which an activation process (step S4) is in operation according to some embodiments. When the activation method (step S4) is performed, the upper side wafer 52 is held by the electrostatic chuck 14 located at the activation position and the lower side wafer 42 is held by the positioning stage carriage 11. The plurality of the upper side atomic beam sources 18-1 to 18-2 of the activation device 16 emits the fast atom beam Bb1 and the fast atom beam Bb2, respectively to the upper side wafer 52. Thereby, the surface 50 to be activated of the upper side wafer 52 is etched and activated. On the other hand, the plurality of the lower side atomic beam sources 17-1 to 17-2 of the activation device 16 emits the fast atom beam Ba1 and the fast atom beam Ba2, respectively to the lower side wafer 42. Thereby, the surface 40 to be activated of the lower side wafer 42 is etched and activated.

Figure 10:
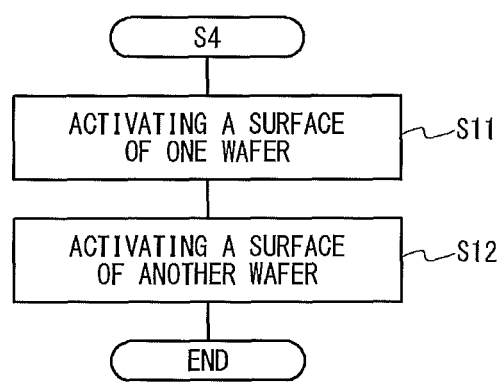
FIG. 10 is a flow chart indicating an activation process according to some embodiments.

FIG. 10 is a flow chart indicating an activation process (step S4) according to the present embodiment. The method of activating the surface 40 to be activated of the lower side wafer 42 and the surface 50 to be activated of the upper side wafer 52 includes a step of activating a surface of one wafer (step S11) and a step of activating a surface of another wafer (step S12). Note that "one wafer" corresponds to one of the upper side wafer 52 and the lower side wafer 42, and "another wafer" corresponds to the other of the upper side wafer 52 and the lower side wafer 42. The step S11 and the step S12 can be performed at the same time during the same period, can be performed such that an operation time of the step S11 and an operation time of the step S12 are partially overlapped, or can be performed such that the operation time of the step S11 and the operation time of the step S12 are not overlapped. Note that the step of activating the surface 40 to be activated of the lower side wafer 42 and the step of activating the surface 50 to be activated of the upper side wafer 52 are performed under individual activation conditions for each wafer. That is, activation conditions, namely, activation conditions with respect to the fast atom beams Ba1, Ba2 and the fast atom beams Bb1, Bb2, such as irradiation period, start timing of the irradiation, end timing of the irradiation, voltage value or current value applied to each of the atomic beam sources, type of gas, flow rate of the gas, density of the each fast atom beam, speed of the each fast atom beam, and energy of the each fast atom beam are set independently for each of the plurality of the lower side atomic beam sources 17-1 to 17-2 and the plurality of the upper side atomic beam sources 18-1 to 18-2.

Figure 11:
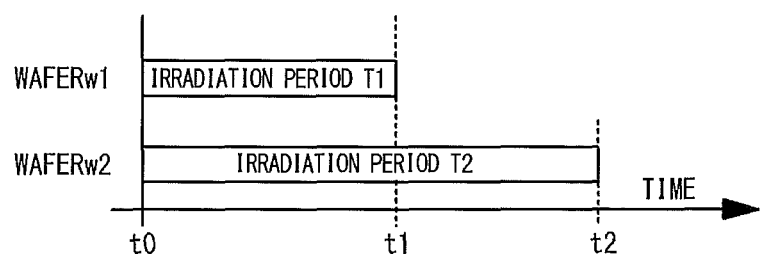
FIG. 11 is a timing chart indicating an example of an activation process according to the first embodiment.

FIG. 11 is a timing chart indicating an example of an activation process (step S4) according to the present embodiment. In the following, for the sake of explanation, it is supposed that the "one wafer" (in FIG. 11, "WAFER w1") corresponds to the upper side wafer 52 and the "other wafer" (in FIG. 11, "WAFER w2") corresponds to the lower side wafer 42.

(1) Step S11

The first activation section 73-1 controls the plurality of gas type switching mechanisms 61 to supply a predetermined gas (for example, argon gas) to the plurality of the upper side atomic beam sources 18-1 to 18-2. The first activation section 73-1 controls the activation device 16 to emit two fast atom beams one by one from the plurality of upper side atomic beam sources 18-1 to 18-2 or emit two fast atom beams simultaneously from the plurality of upper side atomic beam sources 18-1 to 18-2 (time t0). In case of emitting the two fast atom beams one by one from the plurality of upper side atomic beam sources 18-1 to 18-2, emission is stopped, for example, when total emission period of the two of the upper side atomic beam sources 18-1 to 18-2 reaches irradiation period T1 (time t1). In case of emitting the two fast atom beams simultaneously from the plurality of upper side atomic beam sources 18-1 to 18-2, emission is stopped, for example, when both of the irradiation period of the upper side atomic beam source 18-1 and the irradiation period of the upper side atomic beam source 18-2 reach irradiation period T1, respectively (time t1).

(2) Step S12

On the other hand, the second activation section 73-2 controls the plurality of gas type switching mechanism 61 to supply a predetermined gas (for example, argon gas) to the plurality of the lower side atomic beam sources 17-1 to 17-2. The second activation section 73-2 controls the activation device 16 to emit two fast atom beams one by one from the plurality of lower side atomic beam sources 17-1 to 17-2 or emit two fast atom beams simultaneously from the plurality of lower side atomic beam sources 17-1 to 17-2 (time t0). In case of emitting the two fast atom beams one by one from the plurality of lower side atomic beam sources 17-1 to 17-2, emission is stopped, for example, when total emission period of the two of the lower side atomic beam sources 17-1 to 17-2 reaches irradiation period T2 (time t2). In case of emitting the two fast atom beams simultaneously from the plurality of lower side atomic beam sources 17-1 to 17-2, emission is stopped, for example, when both of the irradiation period of the lower side atomic beam source 17-1 and the irradiation period of the lower side atomic beam source 17-2 reaches irradiation period T2, respectively (time t2).

In the above mentioned example of the activation method (step S4), the steps S11 and the step S12 are started at the same time (time t0). That is, the irradiation start timings are the same. Also, the step S11 is completed earlier (time t1) and the step S12 is completed later (time t2). That is, the irradiation end timings are different from each other. Therefore, the irradiation periods are different from each other. In this example, the irradiation period T2 of the step S12 is longer than the irradiation period T1 of the step S11. In this example, the fast atom beams emitted from the plurality of the upper side atomic beam sources 18-1 to 18-2 and the fast atom beams emitted from the plurality of the lower side atomic beam sources 17-1 to 17-2 may be different from each other in response that the upper side wafer 52 and the lower side wafer 42 are different from each other. That is, at least one of the voltage value applied to each of the atomic beam sources, the current value applied to each of the atomic beam sources, the type of gas, the flow rate of the gas, the density of the fast atom beam, the speed of the fast atom beam, or the energy of the fast atom beam is different between the fast atom beam from the upper side beam sources and the fast atom beam from the lower side beam sources.

In this way, surfaces of both wafers can be properly activated, even when at least one of etching rate, thickness of oxide layer, or thickness of adsorption layer is different between the upper side wafer 52 and the lower side wafer 42, by setting activation conditions for the upper side wafer 52 and the lower side wafer 42 independently. Thereby, both wafers can be properly bonded. Such an effect is particularly pronounced in the case that materials of the upper side wafer 52 are different from materials of the lower side wafer 42.

In the above mentioned activation method, a period (from time t1 to time t2), during which the one wafer (for example, the lower side wafer 42 in FIG. 11) is irradiated for etching (sputtering) with the fast atom beam and the other wafer (for example, the upper side wafer 52 in FIG. 11) is not irradiated with the fast atom beam, is provided. Thereby, it is possible to deposit sputter particles (for example: metal or Si) generated by irradiating the one wafer with the fast atom beam on the surface of the other wafer, which has been already etched (sputtered) and activated. Thereby, it is possible to form the intermediate layer (adhesive layer) made from material of the one wafer between the one wafer and the other wafer. As a result, bonding strength can be increased when the two wafers are bonded.

In the case of above mentioned activation method, during the period from the time t1 to time t2, the emission of the fast atom beams from the plurality of upper side atomic beam sources 18-1 to 18-2 are stopped. However, it is possible that energy of the fast atom beams during the period from the time t1 to time t2 is lowered as compared to energy of the fast atom beams before time t1, in place of stopping the emission of the fast atom beams.

In this case, for example, if the energy of the fast atom beams from the plurality of upper side atomic beam sources 18-1 to 18-2 is somewhat high, the sputter particles, from the lower side wafer 42, deposited on the upper side wafer 52 can be etched (sputtered). Thereby, it is possible to keep the activated surface 50 in activated state while the activated surface 50 of the upper side wafer 52 is not too much etched. For example, if the energy of the fast atom beams from the plurality of upper side atomic beam sources 18-1 to 18-2 is somewhat low, it is possible to deposit the sputter particles (for example: metal or Si) generated by irradiating the lower side wafer 42 with the fast atom beams on the upper side wafer 52 while etching (sputtering). Thereby, it is possible to interpose the intermediate layer (the adhesive layer) in bonding, and the bonding strength can be increased.

Figure 12:
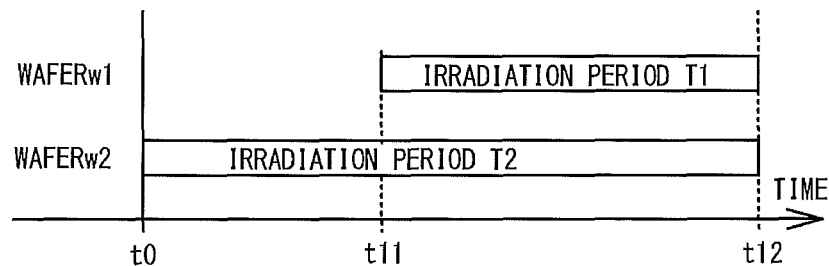
FIG. 12 is a timing chart indicating another example of an activation process according to the first embodiment.

FIG. 12 is a timing chart indicating another example of the activation process (step S4) according to the present embodiment. In the case indicated in FIG. 11, irradiation start timing of the plurality of upper side atomic beam sources 18-1 to 18-2 and irradiation start timing of the plurality of lower side atomic beam sources 17-1 to 17-2 are the same (both of the irradiation start time is time t0). That is, irradiation start time is the same. On the other hand, in the case indicated in FIG. 12, irradiation end timing of the plurality of upper side atomic beam sources 18-1 to 18-2 and irradiation end timing of the plurality of lower side atomic beam sources 17-1 to 17-2 are the same (both of the irradiation end time is time t12). That is, irradiation end time is the same.

In this case, the plurality of upper side atomic beam sources 18-1 to 18-2 activates the upper side wafer 52 and the plurality of lower side atomic beam sources 17-1 to 17-2 activates the lower side wafer 42 until irradiation end time (time t12). Therefore, activation state of the activated surface 50 of the upper side wafer 52 and activation state of the activated surface 40 of the lower side wafer 42 can be approximately matched with each other. Thereby, it is possible to bond both wafers under the uniform activation conditions.

Second Embodiment

A room temperature bonding apparatus and a room temperature bonding method according to the second embodiment will be explained. The second embodiment is different from the first embodiment in the points: irradiation period T1 during which one wafer is irradiated with the fast atom beam for etching (sputtering) and irradiation period T2 during which another wafer is irradiated with the fast atom beam for etching (sputtering) are partially overlapped; irradiation start time for the one wafer and irradiation start time for the other wafer are different as well as irradiation end time for the one wafer and irradiation end time for the other wafer are different. In the following, different points between the first embodiment and the second embodiment are mainly explained.

Configuration of the room temperature bonding apparatus according to the present embodiment (FIGS. 1 to 7) is similar to that of the first embodiment. Therefore, explanation thereof is omitted.

In addition, with respect to the room temperature bonding method (operation of the room temperature bonding apparatus), processes relating to FIGS. 8 to 10 are similar between the first embodiment and the second embodiment. Therefore, explanation thereof is omitted.

Figure 13:
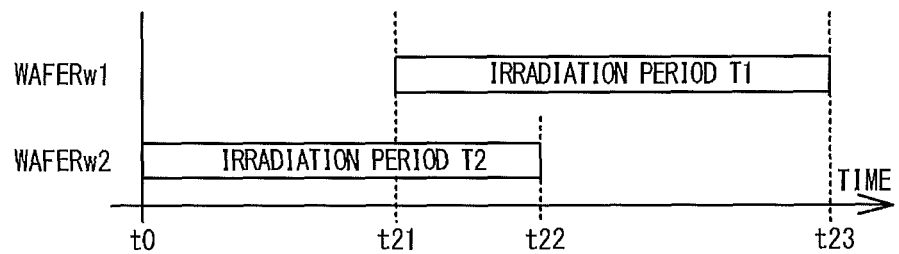
FIG. 13 is a timing chart indicating an example of an activation process according to the second embodiment.

FIG. 13 is a timing chart indicating an example of an activation process (step S4) according to the present embodiment. In the following, for the sake of explanation, it is supposed that the "one wafer" (in FIG. 13, "WAFER w2") corresponds to the upper side wafer 52 and the "other wafer" (in FIG. 13, "WAFER w1") corresponds to the lower side wafer 42.

(1) Step S11

The first activation section 73-1 controls the plurality of gas type switching mechanisms 61 to supply a predetermined gas (for example, argon gas) to the plurality of the upper side atomic beam sources 18-1 to 18-2. The first activation section 73-1 controls the activation device 16 to emit two fast atom beams one by one from the plurality of upper side atomic beam sources 18-1 to 18-2 or emit two fast atom beams simultaneously from the plurality of upper side atomic beam sources 18-1 to 18-2 (time t0). In case of emitting the two fast atom beams one by one from the plurality of upper side atomic beam sources 18-1 to 18-2, emission is stopped, for example, when total emission period of the two of the upper side atomic beam sources 18-1 to 18-2 reaches irradiation period T2 (time t22). In case of emitting the two fast atom beams simultaneously from the plurality of upper side atomic beam sources 18-1 to 18-2, emission is stopped, for example, when both of the irradiation period of the upper side atomic beam source 18-1 and the irradiation period of the upper side atomic beam source 18-2 reach irradiation period T2, respectively (time t22).

(2) Step S12

On the other hand, the second activation section 73-2 controls the plurality of gas type switching mechanisms 61 to supply a predetermined gas (for example, argon gas) to the plurality of the lower side atomic beam sources 17-1 to 17-2. The second activation section 73-2 controls the activation device 16 to emit two fast atom beams one by one from the plurality of lower side atomic beam sources 17-1 to 17-2 or emit two fast atom beams simultaneously from the plurality of lower side atomic beam sources 17-1 to 17-2 (time t21). In case of emitting the two fast atom beams one by one from the plurality of lower side atomic beam sources 17-1 to 17-2, emission is stopped, for example, when total emission period of the two of the lower side atomic beam sources 17-1 to 17-2 reaches irradiation period T1 (time t22). In case of emitting the two fast atom beams simultaneously from the plurality of lower side atomic beam sources 17-1 to 17-2, emission is stopped, for example, when both of the irradiation period of the lower side atomic beam source 17-1 and the irradiation period of the lower side atomic beam source 17-2 reach irradiation period T1, respectively (time t23).

In the above mentioned example of the activation method (step S4), the step S11 is first started (time t0) and the step S12 is started thereafter. That is, the irradiation start timings are different. Also, the step S11 is completed earlier (time t22) and the step S12 is completed later (time t23). That is, the irradiation end timings are different from each other. Irradiation period of the step S11 and irradiation period of the step S12 may be different or may be the same. In the example indicated in FIG. 13, the irradiation period T1 of the step S12 and the irradiation period T2 of the step S11 are approximately same. In this example, the fast atom beams emitted from the plurality of the upper side atomic beam sources 18-1 to 18-2 and the fast atom beams emitted from the plurality of the lower side atomic beam sources 17-1 to 17-2 may be different from each other in response that the upper side wafer 52 and the lower side wafer 42 are different from each other. That is, at least one of the voltage value applied to each of the atomic beam sources, the current value applied to each of the atomic beam sources, the type of gas, the flow rate of the gas, the density of the fast atom beam, the speed of the fast atom beam, or the energy of the fast atom beam is different between the fast atom beam from the upper side beam sources and the fast atom beam from the lower side beam sources.

In this way, surfaces of both wafers can be properly activated, even when at least one of etching rate, thickness of oxide layer, or thickness of adsorption layer is different between the upper side wafer 52 and the lower side wafer 42, by setting activation conditions for the upper side wafer 52 and the lower side wafer 42 independently. Thereby, both wafers can be properly bonded. Such an effect is particularly pronounced in the case materials of the upper side wafer 52 are different from materials of the lower side wafer 42.

In the above mentioned activation method, a period (from time t0 to time t21), during which the one wafer (for example, the upper side wafer 52 in FIG. 13) is irradiated for etching (sputtering) with the fast atom beam and the other wafer (for example, the lower side wafer 42 in FIG. 13) is not irradiated with the fast atom beam, is provided. Thereby, it is possible to deposit sputter particles (for example: metal or Si) generated by irradiating the one wafer with the fast atom beam on the surface of the other wafer. It is possible that the oxide layer or the adsorption layer on the surface of the other wafer can be activated by depositing the sputter particles, which are active, on the surface of the other wafer. Thereby, it is possible to easily etch the oxide layer or the adsorption layer on the surface of the other wafer during the later etching process for the other wafer.

Moreover, in the above mentioned activation method, a period (from time t22 to time t23), during which the other wafer is irradiated for etching (sputtering) with the fast atom beam and the one wafer is not irradiated with the fast atom beam, is provided. Thereby, it is possible to deposit sputter particles (for example: metal or Si) generated by irradiating the other wafer with the fast atom beam on the surface of the one wafer, which has been already etched (sputtered). Thereby, it is possible to form the intermediate layer (adhesive layer) made from material of the other wafer between the one wafer and the other wafer. As a result, bonding strength can be increased when the two wafers are bonded.

In the case of above mentioned activation method, during the period from the time t22 to time t23, the emission of the fast atom beams from the plurality of upper side atomic beam sources 18-1 to 18-2 are stopped. However, it is possible that energy of the fast atom beams during the period from the time t22 to time t23 is lowered as compared to energy of the fast atom beams before time t22, in place of stopping the emission of the fast atom beams.

In this case, for example, if the energy of the fast atom beams from the plurality of upper side atomic beam sources 18-1 to 18-2 is somewhat high, the sputter particles, from the lower side wafer 42, deposited on the upper side wafer 52 can be etched (sputtered). Thereby, it is possible to keep the activated surface 50 in activated state while the activated surface 50 of the upper side wafer 52 is not too much etched. For example, if the energy of the fast atom beams from the plurality of upper side atomic beam sources 18-1 to 18-2 is somewhat low, it is possible to deposit the sputter particles (for example: metal or Si) generated by irradiating the lower side wafer 42 with the fast atom beams on the upper side wafer 52 while etching (sputtering). Thereby, it is possible to interpose the intermediate layer (the adhesive layer) in bonding, and the bonding strength can be increased.

Figure 14:
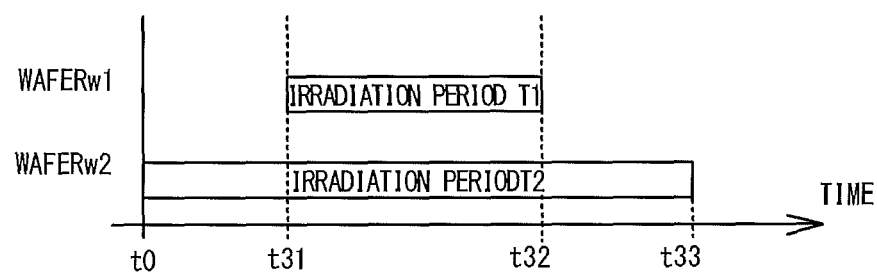
FIG. 14 is a timing chart indicating another example of an activation process according to the second embodiment.

FIG. 14 is a timing chart indicating another example of the activation process (step S4) according to the present embodiment. In the case indicated in FIG. 13, the plurality of upper side atomic beam sources 18-1 to 18-2 start irradiating earlier (time t0) than the plurality of lower side atomic beam sources 17-1 to 17-2, and the plurality of upper side atomic beam sources 18-1 to 18-2 end irradiating earlier (time t22) than the plurality of lower side atomic beam sources 17-1 to 17-2. On the other hand, in the case indicated in FIG. 14, the plurality of lower side atomic beam sources 17-1 to 17-2 irradiate beams temporarily during beams are emitted from the plurality of upper side atomic beam sources 18-1 to 18-2. In other words, the irradiation period T1 (from time t31 to time t32) of the plurality of lower side atomic beam sources 17-1 to 17-2 is provided in the middle portion of the irradiation period T2 (time T0 to time t33) of the plurality of upper side atomic beam sources 18-1 to 18-2. Thereby, the irradiation start time of the plurality of lower side atomic beam sources 17-1 to 17-2 is later than the irradiation start time of the plurality of upper side atomic beam sources 18-1 to 18-2 and the irradiation end time of the plurality of lower side atomic beam sources 17-1 to 17-2 is earlier than the irradiation end time of the plurality of upper side atomic beam sources 18-1 to 18-2. The case indicated in FIG. 14 can provide the similar effect with the case indicated in FIG. 13.

Figure 15:
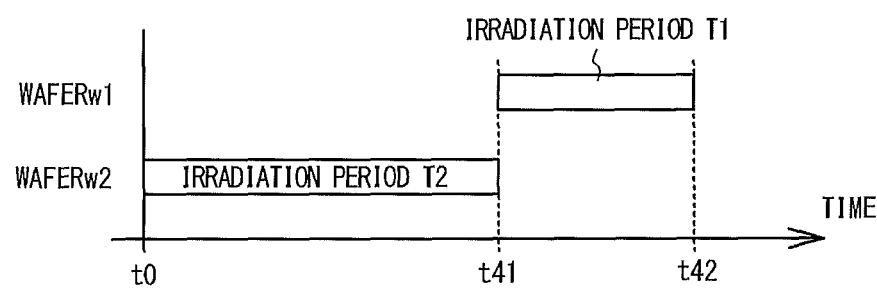
FIG. 15 is a timing chart indicating still another example of an activation process according to the second embodiment.

FIG. 15 is a timing chart indicating still another example of the activation process according to the present embodiment. In the case indicated in FIG. 13, the irradiation period T1 of the plurality of upper side atomic beam sources 18-1 to 18-2 is overlapped with the irradiation period T2 of the plurality of lower side atomic beam sources 17-1 to 17-2. On the other hand, in the case indicated in FIG. 15, the irradiation period T1 (from time T41 to time t42) of the plurality of lower side atomic beam sources 17-1 to 17-2 is provided immediately after the end of the irradiation period T2 (from time t0 to time t41) of the plurality of upper side atomic beam sources 18-1 to 18-2. In other words, the irradiation start time and irradiation end time of the plurality of lower side atomic beam sources 17-1 to 17-2 are relatively late. The case indicated in FIG. 15 can provide the similar effect with the case indicated in FIG. 13.

In any of the first and second embodiments, a method of irradiating only one wafer with the fast atom beam for etching (sputtering) without irradiating the other wafer with the fast atom beam based on the conditions of wafers can be adopted.

Although invention has been explained in conjunction with several embodiments, it will be apparent to the person having ordinary skill in the art that these embodiments are merely provided to illustrate the present invention. Therefore, the meaning of the claimed invention should not be limited by relying on these embodiments. The claimed invention should not be limited to above mentioned embodiments. The configuration and details of the present invention can be variously modified within the scope the person having ordinary skill in the art can understand the present invention.

It should be noted that this application claims a priority based on Japan Patent Application No. JP 2012-215151 filed on Sep. 27, 2012, and the disclosure thereof is incorporated herein by reference.

The invention claimed is:

1. A room temperature bonding method comprising:
    irradiating a first surface of a first substrate with a first activation beam;
    irradiating a second surface of a second substrate with a second activation beam; and
    bonding the first substrate and the second substrate after first irradiation as irradiation of the first activation beam and second irradiation as irradiation of the second activation beam are performed,
wherein a first irradiation period of the first irradiation is longer than a second irradiation period of the second irradiation,
    wherein the first activation beam includes one activation beam emitted from a first beam source and one activation beam emitted from a second beam source, and the first beam source and the second beam source have two-fold rotational symmetry with respect to an axis.

2. The room temperature bonding method according to claim 1, wherein a region between the first substrate and the second substrate is constituted only by a space throughout an irradiation period including the first irradiation period and the second irradiation period.

3. The room temperature bonding method according to claim 1, wherein a irradiation period including the first irradiation period and the second irradiation period comprises a period during which the first irradiation and the second irradiation are performed at the same time and a period during which only one of the first irradiation or the second irradiation is performed.

4. The room temperature bonding method according to claim 1, wherein start time of the first irradiation and start time of the second irradiation are the same with each other, or
    end time of the first irradiation and end time of the second irradiation are the same with each other.

5. The room temperature bonding method according to claim 1, wherein the first irradiation period or the second irradiation period is zero.

6. The room temperature bonding method according to claim 1, wherein the first activation beam and the second activation beam are different from each other.

7. The room temperature bonding method according to claim 1, wherein a material of the first substrate is a different kind of material than a material of the second substrate.

8. A room temperature bonding method comprising:
    irradiating a first surface of a first substrate with a first activation beam;
    irradiating a second surface of a second substrate with a second activation beam; and
    bonding the first substrate and the second substrate after first irradiation as irradiation of the first activation beam and second irradiation as irradiation of the second activation beam are performed, wherein a first irradiation period of the first irradiation is longer than a second irradiation period of the second irradiation, wherein the start time of the first irradiation and the start time of the second irradiation are different from each other, and the end time of the first irradiation and the end time of the second irradiation are the same.

9. The room temperature bonding method according to claim 8, wherein an irradiation period including the first irradiation period and the second irradiation period comprises a period during which the first irradiation and the second irradiation are performed at the same time and a period during which only one of the first irradiation or the second irradiation is performed.

10. The room temperature bonding method according to claim 8, wherein start time of the first irradiation and start time of the second irradiation are the same, or the end time of the first irradiation and end time of the second irradiation are the same.

11. The room temperature bonding method according to claim 8, wherein the first irradiation period or the second irradiation period is zero.

12. The room temperature bonding method according to claim 8, wherein the first activation beam and the second activation beam are different from each other.

13. The room temperature bonding method according to claim 8, wherein a material of the first substrate is a different kind of material than a material of the second substrate.

14. The room temperature bonding method according to claim 8, wherein a region between the first substrate and the second substrate is constituted only by a space throughout an irradiation period including the first irradiation period and the second irradiation period.

15. A room temperature bonding method comprising:

irradiating a first surface of a first substrate with a first activation beam;

irradiating a second surface of a second substrate with a second activation beam; and bonding the first substrate and the second substrate after first irradiation as irradiation of the first activation beam and second irradiation as irradiation of the second activation beam are performed, wherein a first irradiation period of the first irradiation is longer than a second irradiation period of the second irradiation, wherein the start time of the first irradiation and the start time of the second irradiation are different from each other, and the end time of the first irradiation and the end time of the second irradiation are different from each other.

16. A room temperature bonding method comprising:

irradiating a first surface of a first substrate with a first activation beam;

irradiating a second surface of a second substrate with a second activation beam; and bonding the first substrate and the second substrate after first irradiation as irradiation of the first activation beam and second irradiation as irradiation of the second activation beam are performed, wherein a first irradiation period of the first irradiation is longer than a second irradiation period of the second irradiation, wherein an irradiation period including the first irradiation period and the second irradiation period comprises a period during which only one of the first irradiation and the second irradiation is performed, and wherein in the period during which only one of the first irradiation and the second irradiation is performed, an intermediate layer made from material of one of the first substrate and the second substrate is formed between the first substrate and the second substrate by depositing sputter particles generated by irradiating the first substrate on the second surface of the second substrate.

* * * * *